(12) United States Patent
Jang et al.

(10) Patent No.: US 7,814,452 B1
(45) Date of Patent: Oct. 12, 2010

(54) FUNCTION SYMMETRY-BASED OPTIMIZATION FOR PHYSICAL SYNTHESIS OF PROGRAMMABLE INTEGRATED CIRCUITS

(75) Inventors: Tetse Jang, San Jose, CA (US); Vi Chi Chan, Statin (HK); Kevin Chung, Toronto (CA)

(73) Assignee: Xilinx, Inc., San Jose, CA (US)

( * ) Notice: Subject to any disclaimer, the term of this patent is extended or adjusted under 35 U.S.C. 154(b) by 257 days.

(21) Appl. No.: 11/981,916

(22) Filed: Nov. 1, 2007

(51) Int. Cl.
*G06F 17/50* (2006.01)

(52) U.S. Cl. .............................................. 716/7; 716/3

(58) Field of Classification Search ...................... 716/3, 716/7, 16–17
See application file for complete search history.

(56) References Cited

U.S. PATENT DOCUMENTS

| | | | | |
|---|---|---|---|---|
| 2001/0028257 | A1* | 10/2001 | Kaptanoglu | .................. 326/41 |
| 2006/0031730 | A1* | 2/2006 | Hsiao et al. | .................. 714/738 |
| 2006/0117280 | A1 | 6/2006 | Wallace | |

OTHER PUBLICATIONS

Ling et al., "BddCut: Towards Scalable Symbolic Cut Enumeration," IEEE, Jul. 2007, pp. 408-413.*
Firusabad et al., "A Novel Approach to Determine Minimal Tie-Sets of Complex Network," IEEE, Mar. 2004, pp. 61-70.*
Xilinx, Inc.; U.S. Appl. No. 11/981,910 by Tetse Jang et al.; filed Nov. 1, 2007.
Manohararajah, Valavan et al.; "Timing Driven Functional Decomposition for FPGAs"; IWLS, Lake Arrowhead, CA; Jun. 2005; pp. 415-422.
Chen, Deming et al.; "DAOmap: A Depth-Optimal Area Optimization Mapping Algorithm for FPGA Designs"; Copyright 2004 IEEE; pp. 752-759.
Mischenko, Alan et al.; "Improvements to Technology Mapping for LUT-Based FPGAs"; IEEE Transactions on Computer-Aided Design of Integrated Circuits and Systems; vol. 26, No. 2; Feb. 2007; Copyright 2007 IEEE; pp. 240-253.
Lai, Yung-Te et al.; "BDD Based Decomposition of Logic Functions with Application to FPGA Synthesis"; 30th ACM/IEEE Design Automation Conference; Copyright 1993 ACM; pp. 642-647.
Stanion, Ted et al.; A Method for Finding Good Ashenhurst Decompositions and Its Application to FPGA Synthesis: 32nd ACM/IEEE Design Automation Conference; Copyright 1995 ACM; pp. 1-5.
Jiang, Jie-Hong et al.; "Unified Functional Decomposition via Encoding for FPGA Technology Mapping"; IEEE Transactions on Very Large Scale Integration (VLSI) Systems; vol. 9, No. 2; Apr. 2001; Copyright 2001 IEEE; pp. 251-260.

(Continued)

*Primary Examiner*—Vuthe Siek
(74) *Attorney, Agent, or Firm*—Kevin T. Cuenot; Lois D. Cartier (57) ABSTRACT

A computer-implemented method of technology mapping a circuit design for implementation within a programmable logic device can include determining a plurality of cut sets for the circuit design, wherein each cut set includes a plurality of cuts. The method can include evaluating each cut set according to a cost function that depends, at least in part, upon a measure of inter-cut symmetry and selecting a cut set according to the cost function. Each cut of the selected cut set can represent an instantiation of at least one logic component within the programmable logic device. The circuit design specifying the selected cut set can be output.

13 Claims, 8 Drawing Sheets

OTHER PUBLICATIONS

David Dye; "Physical Synthesis and Optimization with ISE 9.1i"; White Paper: Virtex and Spartan FPGAs; WP230 (v1.1); May 16, 2007; available from www.Xilinx.com; pp. 1-9.

Singh, Deshanand P. et al.; "Two-Stage Physical Synthesis for FPGAs"; IEEE 2005 Custom Integrated Circuits Conference; Copyright 2005 IEEE; pp. 171-178.

Manohararajah, Valavan et al.; Heuristics for Area Minimization in LUT-Based FPGA Technology Mapping; IEEE Transactions on Computer-Aided Design of Integrated Circuits and Systems; vol. 25, No. 11; Nov. 2006; Copy right 2006 IEEE; pp. 2331-2340.

Ding, Yuzheng et al.; "The Effect of Post-Layout Pin Permutation on Timing"; FPGA '05; Feb. 20-22, 2005; Copyright 2005 ACM; pp. 41-50.

Suaris, Peter et al.; "Incremental Physical Resynthesis for Timing Optimization"; FPGA '04; Feb. 22-24, 2004; Copyright 2004 ACM; pp. 99-108.

Zhang, Jin S. et al.; "Symmetry Detection for Large Boolean Functions Using Circuit Representation, Simulation, and Satisfiability"; Design Automation Conference 2006; 43rd ACM/IEEE; Jul. 24-28, 2006; pp. 510-515.

* cited by examiner

FUNCTION SYMMETRY-BASED OPTIMIZATION FOR PHYSICAL SYNTHESIS OF PROGRAMMABLE INTEGRATED CIRCUITS

FIELD OF THE INVENTION

The embodiments disclosed herein relate to integrated circuit devices (ICs). More particularly, the embodiments relate to improving timing of a circuit design to be implemented within a programmable logic device type of IC by reducing interconnect delays.

BACKGROUND

The process of implementing a circuit design within a programmable logic device (PLD) typically begins with an architecture description of the circuit design. This description can be specified in a hardware description language such as Verilog or VHDL. Most circuit designs have one or more timing requirements that must be observed. The timing requirements, also called timing constraints, can be expressed within the programmatic description of the circuit design or as supplemental information or files accompanying the circuit design.

Electronic Design Automation (EDA) tools can process the circuit design in an attempt to find an implementation for a given PLD that meets the timing requirements. The EDA tool typically converts the HDL description of the circuit design into a gate-level representation of the circuit design. With respect to field programmable gate array type PLDs, the gate level description can be technology mapped to vendor specific structures available within the PLD. Elements of the circuit design are assigned to different components of the PLD, e.g., lookup tables, flip-flops, block random access memories, processors, configurable logic blocks, and the like.

The EDA tool can place the technology mapped circuit design. The terms "placing" and 'placement' refer to the assignment of elements of the circuit design, now associated with component types available on the PLD, to pre-fabricated sites, or locations, on the PLD. After placement, connections of the circuit design can be routed to generate a routed circuit design. The resulting circuit design is transformed into a bitstream that, when loaded into the PLD, configures the PLD to implement the circuit design.

Reduction in internal delays of PLDs can increase operational speed and efficiency. In earlier PLDs, logic delays were largely dominant over interconnect delays. That is, delays associated with the components of PLDs were larger than the delays associated with the wires connecting those components. With the growing complexity of modern PLDs and the proliferation of sub-micron technology, interconnect delays have become dominant over logic delays. As such, any attempts to reduce delay in modern PLDs must address interconnect delays to be effective.

SUMMARY

The embodiments disclosed herein relate to programmable logic devices (PLDs) and, more particularly, to improving timing of circuit designs implemented within PLDs. One embodiment of the present invention can include a computer-implemented method of technology mapping a circuit design for implementation within a PLD. The method can include determining a plurality of cut sets for the circuit design, wherein each cut set includes a plurality of cuts, and evaluating each cut set according to a cost function that depends, at least in part, upon a measure of inter-cut symmetry. A cut set can be selected according to the cost function. Each cut of the selected cut set can represent an instantiation of at least one logic component within the PLD. The circuit design specifying the selected cut set can be output.

Evaluating each cut set can include, for each cut set, determining a number of inter-cut symmetric signal sets and adjusting the measure of inter-cut symmetry for the cut set according to the number of inter-cut symmetric signal sets. An inter-cut symmetric signal set can include at least two nodes. A first node of the inter-cut symmetric signal set can be located in a first cut of a cut set and a second node of the inter-cut symmetric signal set can be located in a second cut of the same cut set. Adjusting the measure of inter-cut symmetry can include adjusting the measure of inter-cut symmetry in direct proportion to the number of inter-cut symmetric signal sets for the cut set.

The computer-implemented method can include assigning cuts of the selected cut set to component types of the PLD, selecting a cone including a plurality of logic components of the circuit design, and performing functional decomposition on the selected cone according, at least in part, to symmetry of variables of the selected cone. Performing functional decomposition can include identifying a plurality of symmetric signals of the selected cone, defining a free set of signals including at least one signal of the plurality of symmetric signals, and defining a bound set of signals including at least one different signal of the plurality of symmetric signals.

Defining the free set of signals can include assigning a timing critical signal to the free set of signals. The computer-implemented method further can include selecting the timing critical signal to be one of the plurality of symmetric signals of the selected cone.

Another embodiment of the present invention can include a computer-implemented method of implementing a circuit design within a PLD. The method can include selecting a cone of the circuit design, wherein the cone includes a plurality of logic components implementing a logic function, and performing functional decomposition on the cone. Functional decomposition can be performed according, at least in part, to symmetry of signals of the selected cone to generate a decomposed logic function. The computer implemented method further can include assigning the decomposed logic function to logic components and outputting the circuit design specifying assigned logic components for the decomposed logic function.

Performing the functional decomposition can include identifying a plurality of symmetric signals of the cone. A free set of signals including at least one signal of the plurality of symmetric signals can be determined. A bound set of signals including at least one different signal of the plurality of symmetric signals also can be determined. Defining a free set of signals can include assigning a timing critical signal to the free set of signals. In one embodiment, the timing critical signal can be selected to be one of the plurality of symmetric signals of the cone.

The computer-implemented method can include first generating a plurality of cut sets for the circuit design and evaluating each cut set according to a cost function that depends, at least in part, upon a measure of inter-cut symmetry. A cut set can be selected according to the cost function. The circuit design can be technology mapped according to the selected cut set.

Evaluating each cut set can include, for each cut set, determining a number of inter-cut symmetric signal sets and adjusting the measure of inter-cut symmetry for the cut set according to the number of inter-cut symmetric signal sets.

An inter-cut symmetric signal set can include at least two nodes. A first node of the inter-cut symmetric signal set can be located in a first cut of a cut set. A second node of the inter-cut symmetric signal set can be located in a second cut of the same cut set.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to improving circuit performance through the reduction of interconnect delays within integrated circuits (ICs), such as programmable logic devices (PLDs). In accordance with the embodiments disclosed herein, a circuit design can be technology mapped in a manner that seeks to increase the number of opportunities for signal swapping with respect to symmetric signals of the circuit design. Various structures of the circuit design further may be functionally decomposed in a manner that increases the number of opportunities for signal swapping of symmetric signals. In the present specification, the same reference characters are used to refer to terminals, signal lines, wires, and their corresponding signals. In this regard, the terms "signal," "wire," "connection," and "terminal" may be used interchangeably within the present specification.

In general, signal swapping refers to the swapping of two symmetric leaf nodes of a fanout-free cone (FFC) identified within the circuit design. Each of the FFCs identified can have a leaf node that is coupled to a node in the FFC via a critical wire. The node linked to the FFC via the critical wire can be referred to as a "critical leaf node." The leaf nodes of each FFC can be processed to identify sets of symmetric leaf nodes that include the critical leaf node and a non-critical leaf node.

Symmetric leaf nodes can be swapped or exchanged according to whether the timing of the circuit design improves as a result of the swapping operation. Thus, within a circuit design, for a given set of symmetric leaf nodes, a signal linking the critical leaf node with the FFC can be exchanged with a signal linking the non-critical leaf node with the FFC. Exchanging signals in this manner can improve timing of the circuit design while leaving functionality unchanged. No changes in the placement of the circuit design need be implemented to realize such timing improvements. Through the application of various processing techniques to be described herein in greater detail, the number of signal swapping opportunities can be increased, thereby providing more opportunities to improve timing of a circuit design.

Figure 1:
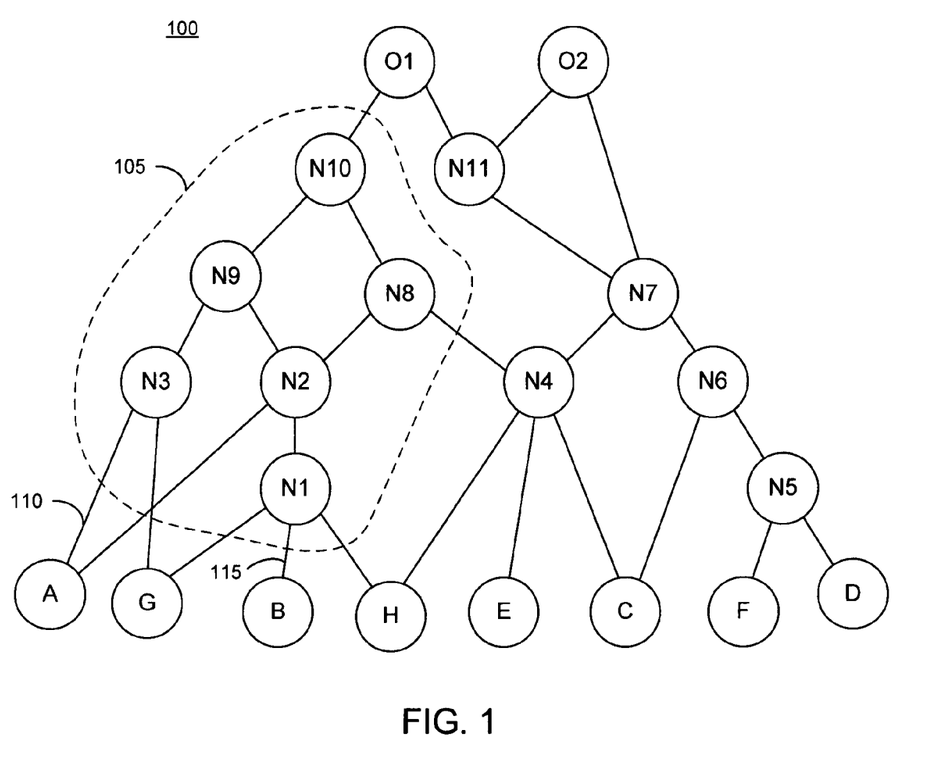
FIG. 1 is a directed acyclic graph (DAG) illustrating a technique for signal swapping in accordance with one embodiment of the present invention.

FIG. 1 is a directed acyclic graph (DAG) 100 illustrating a technique for signal swapping in accordance with one embodiment of the present invention. As is known, a Boolean network can be represented as a DAG in which nodes, such as nodes N1-N11, represent Boolean functions. The branches, or edges, linking the nodes represent Boolean variables. Within the DAG 100, for each node N1-N11, there can be an associated function $F(N_i)$ and a Boolean variable $y(N_i)$ that is output from the node such that $F(N_i)=y(N_i)$. Due to this relationship, the swapping of a node is essentially the same as the swapping of a signal.

Circuit designs often are represented in programmatic form as a DAG, such as DAG 100. It should be appreciated that while the DAG 100 is graphically illustrated, the DAG 100 can be implemented or stored in memory and need not be graphically or visually presented. Components of a circuit design correspond to Boolean functions which generally are represented as nodes. Signals linking the components of a circuit design correspond to Boolean variables which generally are represented as branches connecting the nodes. For example, each of nodes N1-N11, nodes A-H, and nodes O1 and O2 can be mapped to an available component of a PLD. It should be appreciated that nodes can be mapped to components on a one-to-one basis. Alternatively, groups of one or more nodes can be formed and each group can be mapped to one or more components of the PLD.

The DAG 100 includes two primary output nodes O1 and O2. The primary output nodes correspond to sinks in the Boolean network, in that no edges leave the output nodes O1 and O2. The DAG 100 also can include one or more primary input nodes or sources labeled as nodes A-H. No edge leads into a primary input node. In the context of a circuit design for a PLD, e.g., a field programmable gate array (FPGA), the primary output nodes O1 and O2 and the primary input nodes A-H can represent clocked logic such as a register or the like. The nodes N1-N11 of the DAG 100 can represent combinatorial logic that is not clocked.

Region 105 encompasses a plurality of nodes defining an exemplary FFC. As shown, the FFC 105 includes nodes N1, N2, N3, N8, N9, and N10. To better illustrate the nature of the FFC 105, it is useful to consider the following definitions and discussion. A node $N_i$ can be said to be a "fanin" of another node $N_j$ if there is a directed edge, e.g., a branch, leading from node $N_i$ to node $N_j$. The edge can be denoted as $\{N_i, N_j\}$. A node $N_i$ can be said to be a "fanout" of another node $N_j$ if there is a directed edge, e.g., a branch, leading from node $N_j$ to node $N_i$, which can be denoted as $\{N_j, N_i\}$.

A node $N_i$ can be said to be a "transitive fanin" of another node $N_j$ if there is a directed path from $N_i$ to $N_j$. A node $N_i$ can be said to be a "transitive fanout" of a node $N_j$ if there is a directed path from $N_j$ to $N_i$. A "cut" of a node N is a set of nodes of the DAG 100, called leaves, such that each path from a primary input to N. passes through at least one leaf. A "cone" of node N is a subset of all nodes of the DAG reachable through the fanin edges from the given node, where node N is called the root of the cone.

With the above terms in mind, an FFC, such as FFC 105, can be defined as a cone in which the fanouts of every node other than the root are in the same cone. That is, the fanouts of every node of an FFC, excluding the root node, converge to the root node. Referring to the FFC 105, node N10 can be the root node. The leaf nodes of FFC 105 can be nodes A, G, B, H, and N4. Node N4 is excluded from FFC 105 since one fanout from node N4 extends to node N7 and, therefore, does not converge to node N10.

For purposes of illustration, consider the case in which edge 110 connecting node A and node N3, also denoted as {A,N3}, represents a timing critical wire in the circuit design represented by DAG 100. The criticality of a connection can be measured by the "slack" of a connection. Slack refers to the difference between the time a signal is to arrive at a particular destination to meet established timing constraints and the actual time, or estimated time as determined by an electronic design automation (EDA) tool, at which the signal arrives.

A positive slack indicates that the delay for the connection is smaller than the timing constraint imposed upon the connection. A connection with a positive slack conforms with the timing constraint. A slack that is less than zero indicates a connection having a delay that is greater than the timing constraint imposed upon the connection. A negative slack therefore indicates a connection that is failing a timing constraint. A connection having a negative slack can be said to be timing critical. The more negative the slack, the more timing critical the connection.

With a critical edge 110 being identified, node A can be said to be a critical leaf node in that node A is coupled directly to a node in the FFC 105 via the critical edge 110. Node A can be said to be a source of wire 110. In accordance with the embodiments disclosed herein, one or more other leaf nodes of the FFC 105, e.g., nodes G, B, H, and/or N4, that are coupled to the FFC 105 via a non-critical edge and which are symmetric with node A can be identified.

Within Boolean functions, two variables a and b of a function $f(\ldots, a, \ldots, b \ldots)$ are symmetric if the function remains invariant when the variables are swapped. Accordingly, the variables a and b are said to be symmetric if $f(\ldots, a, \ldots, b \ldots) = f(\ldots, b, \ldots, a \ldots)$. In the event that a function has two pairs of symmetric variables such as (a,b) and (b,c), then the variable pair (a,c) is also symmetric. This property, called transitivity, allows one to permute more than two variables simultaneously. Consider the case where (a, b, c, d) are symmetric. The following condition holds true: $f(\ldots, a, \ldots, b, \ldots, c, \ldots, d, \ldots) = f(\ldots, a, \ldots, d, \ldots, b, \ldots, c, \ldots) = f(\ldots, d, \ldots, a, \ldots, b, \ldots, c, \ldots)$. Symmetry can be found in various circuit configurations, e.g., AND gates, XOR gates, and OR gates. Within an AND gate, for instance, all of the input signals are symmetrical, e.g., (a, b, c, d)=(a, c, b, d)=(d, c, b, a).

Several commercially available software-based analysis tools can evaluate Boolean functions, whether specified as a DAG or in other form, to identify pairs of symmetric variables and identify transitive relationships. One example of such an analysis tool is the ABC system from the Berkeley Logic Synthesis and Verification Group. Another example is MVSIS: Logic Synthesis and Verification, which is also available from the Berkeley Logic Synthesis and Verification Group.

Referring again to FIG. 1, if nodes A and B are determined to form a symmetric pair, and edge 115 is non-critical, nodes A and B can be swapped. Swapping nodes A and B effectively swaps the signals 110 and 115. Accordingly, node A will connect to node N1 rather than node N3. Node B will connect to node N3 and N2 rather than node N1. A timing analysis can be performed to determine whether the delay characteristics of the circuit have improved in consequence of the swapped nodes.

It should be appreciated that in cases where transitivity applies, more than two edges may be permuted simultaneously. In illustration, if nodes A, B, and G are symmetric, one or more or all of the nodes can be permuted with respect to one another simultaneously, e.g., during a same swap operation or iteration. For example, nodes A and G can be swapped. Nodes A and B can be swapped. From left to right across FIG. 1, the nodes can be permuted so that the ordering is B, A, G, as opposed to A, G, B.

Figure 2:
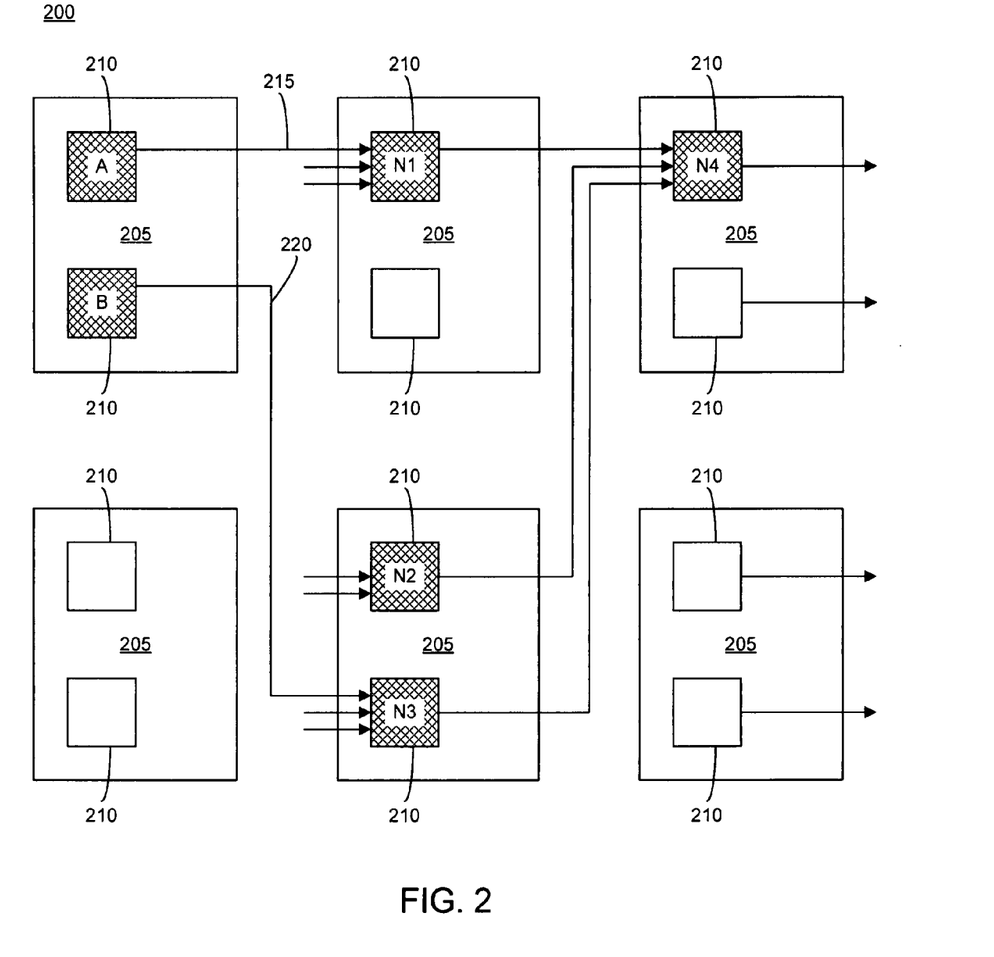
FIG. 2 is a block diagram of a PLD in which a circuit design is implemented in accordance with another embodiment of the present invention.

FIG. 2 is a block diagram of a PLD in which a circuit design 200 is implemented in accordance with another embodiment of the present invention. PLDs are a well-known type of integrated circuit that can be programmed to perform specified logic functions. One type of PLD, the FPGA, typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnects and programmable logic. The programmable interconnects typically include a large number of interconnect lines of varying lengths interconnected by programmable interconnect points (PIPs). The programmable logic implements the logic of a user design using programmable elements that can include, for example, function generators, registers, arithmetic logic, and so forth.

As is known, some varieties of PLDs have programmable logic tiles called CLBs. Arrays of CLBs can form at least part of the programmably configurable circuitry of an FPGA. Depending upon the particular FPGA architecture used, a CLB can include various programmable elements including one or more look-up tables (LUTs). For purposes of illustration, the circuit design 200 has been generalized to include a plurality of CLBs 205. Each CLB 205 can include a plurality of LUTs 210.

The exemplary PLD of FIG. 2 is provided for purposes of illustration only and, as such, is not intended to limit the present invention. It should be appreciated that further programmable tiles having a different structure and/or more complex CLBs having fewer or more LUTs may be included and processed in accordance with the embodiments disclosed herein.

For purposes of illustration, it can be assumed that wire 220 has been identified as a timing critical wire through a timing analysis. LUT B, in reference to the terminal of LUT B coupled to wire 220, can be said to be a critical node. Wire 215, extending from a terminal of LUT A to LUT N1, can be a non-timing critical wire. Accordingly, LUT A can be identified as a non-critical node. Through a symmetrical analysis, LUTs A and B can be identified as symmetric nodes. Accordingly, wires 215 and 220 also can be said to be symmetric. As such, the two wires can be exchanged while maintaining the same circuit functionality.

Having identified LUT B as a timing critical node and wire 220 as a timing critical wire, one or more FFCs can be determined for which LUT B is a leaf node. For example, an FFC can be determined that includes LUTs (nodes) N1, N2, N3, and N4 as members. LUT N4 can function as the root node of the FFC. In this example, the FFC comprised of LUTS N1, N2, N3, and N4 has leaf nodes of LUT A and LUT B.

Because LUTs A and B are symmetric, wires 215 and 220 can be exchanged without changing the functionality of the circuit design. A review of wires 215 and 220 reveals that wire 215 has a shorter delay than wire 220. By exchanging the two wires, the delay of the circuit design 200 can be reduced. Though the wires are exchanged, the resulting circuit design will be functionally equivalent due to the symmetry discussed herein.

Figure 3:
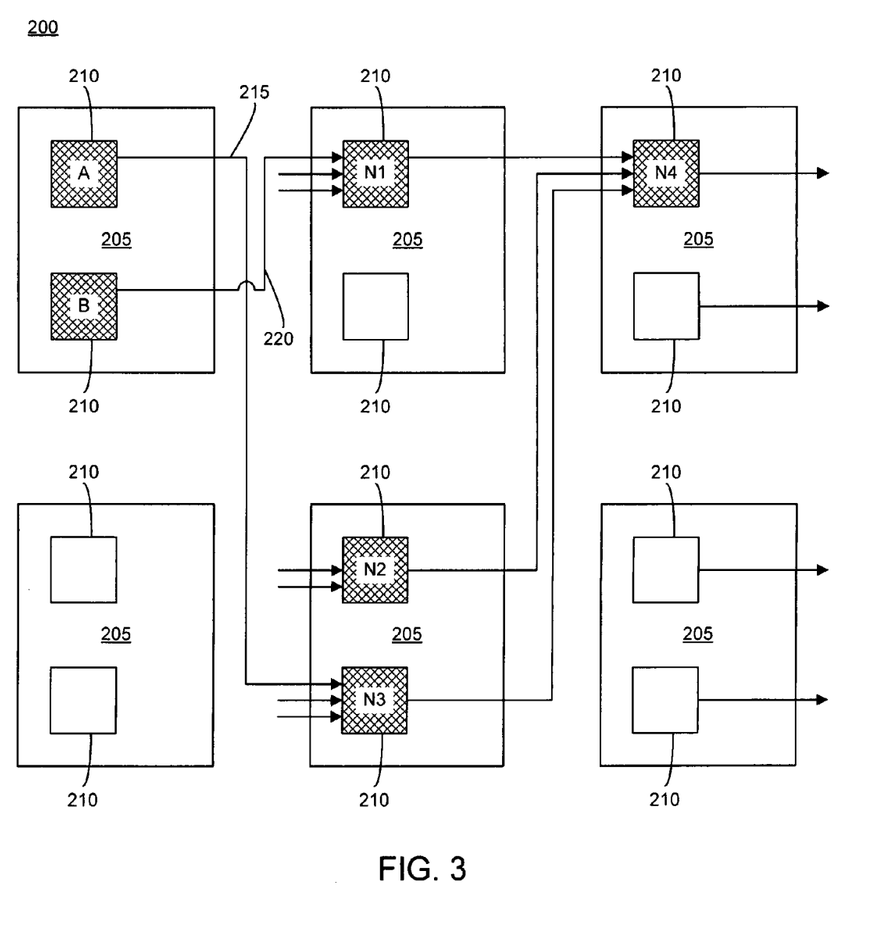
FIG. 3 is a block diagram illustrating the PLD of FIG. 2 wherein signal swapping has been performed upon the circuit design in accordance with another embodiment of the present invention.

FIG. 3 is a block diagram illustrating the PLD of FIG. 2 wherein signal swapping has been performed upon the circuit design in accordance with another embodiment of the present invention. The circuit design 200 includes the plurality of CLBs 205, each having a plurality of LUTs 210. Because LUTs A and B are symmetric, the signals 215 and 220 can be exchanged without changing the operation of the circuit design. Moreover, no alteration of the circuit design, other than the exchange of the two signals, is necessary, e.g., no other movement of LUTs or components in terms of replacement is needed.

After swapping is performed, wire 215 extends from LUT A to LUT N3. Wire 220 extends from LUT B to LUT N1. The resulting circuit design pictured in FIG. 3 is functionally equivalent to the circuit design of FIG. 2 despite the change in routing of signals 215 and 220. A review of the circuit design 200 of FIG. 3 (post swapping) shows that the delay of wire 215 is now longer, while the delay of wire 220 has become shorter. This can result in the criticality of wire 220 being reduced and/or eliminated. Wire 215 may remain non-critical. A timing analysis can be performed to verify the timing of the circuit and the signal paths. Based upon the results of the timing analysis, the swap may be accepted or rejected.

Figure 4A:
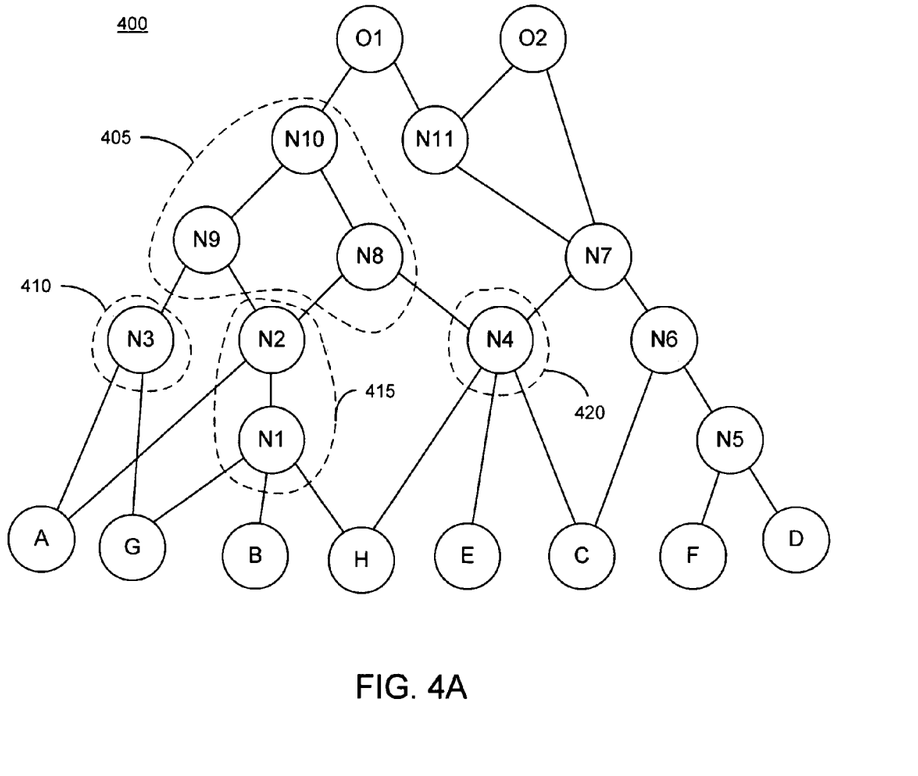
FIG. 4A depicts a DAG illustrating cut enumeration and selection in accordance with another embodiment of the present invention.

FIG. 4A is a DAG 400 illustrating cut enumeration and selection in accordance with another embodiment of the present invention. The DAG 400 is similar to the DAG discussed with reference to FIG. 1. As such the DAG 400 includes primary outputs O1 and O2, nodes N1-N11, and primary inputs A-H. As is known, to implement a circuit design within a PLD, the circuit design must be technology mapped to the available components on the PLD. Groups of one or more nodes of the DAG 400 can be assigned to particular components or structures of the PLD, e.g., LUTs, registers, etc. One way of technology mapping a circuit design is to divide the circuit design, or portions thereof, into a plurality of different cut sets. This process is referred to as "cut enumeration." Each cut of a cut set represents an instantiation of a logic component of the PLD, e.g., a LUT.

As noted, a "cut" of a node N, called the "root," is a set of nodes, referred to as "leaves," of the DAG 400 such that each path from a primary input to N passes through at least one leaf. In illustration, a cut 405, where node N10 is the root, is shown within the DAG 400. In order to cover the leaf nodes of cut 405, further cuts are needed. For example, cuts 410, 415, and 420 can be formed. The collection of cuts 405, 410, 415, and 420 forms a cut set. As can be seen, the selection of a cut, such as cut 405 for node N10, will have a strong impact upon future cut enumeration for that cut set. Since each node must be covered by a cut, the stopping point of one cut effectively indicates a starting point for other cuts in the same cut set.

Figure 4B:
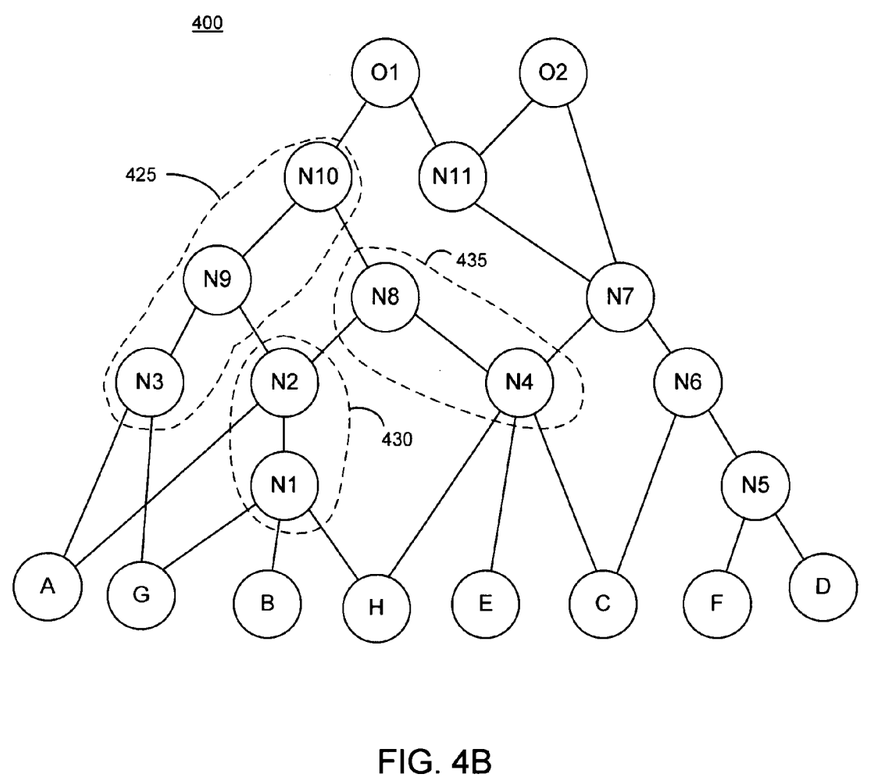
FIG. 4B is the DAG of FIG. 4A illustrating another exemplary cut set.

FIG. 4B is the DAG 400 of FIG. 4A illustrating another exemplary cut set. FIG. 4B illustrates another cut set where cut 425 is selected as a cut with node N10 as the root. To cover the leaf nodes of cut 425, cuts 430 and 435 have been formed. The combination of cuts 425, 430, and 435 forms another cut set. The total cuts for each cut set must, when considered collectively, cover all of the nodes of the DAG 400.

In further illustration, another alternate cut set may be formed of a single cut with node N10 as the root that includes nodes N1, N2, N3, N8, N9, and N10. In this example, The DAG 400 is similar to the DAG discussed with reference to FIG. 1. As noted, all nodes are to be covered or included within a cut. Those skilled in the art will recognize that while the examples provided herein did not address nodes N4, N5, N6, N7, or N11, such nodes would be covered by other cuts within cut sets during cut enumeration.

Once a plurality of cut sets are generated as depicted in FIGS. 4A and 4B, a particular cut set can be selected for use in technology mapping the circuit design. This process is referred to as "cut selection." Typically, cut sets are evaluated using a cost function. The cost function used for cut selection can account for a variety of different factors, e.g., the level of LUTs resulting in the circuit design, the overall number of LUTs, the area needed to implement each cut set within the PLD, timing, and the like. Computing a value of the cost function for each cut set yields an estimate of the "goodness" of each cut set. The cut set having the highest measure of goodness can be selected for use in technology mapping the circuit design.

There are a variety of known techniques for performing cut enumeration and selection. For example, the following references, each of which is fully incorporated herein by reference, discuss cut enumeration and/or cut selection: "DAOmap: A Depth-Optimal Area Optimization Mapping Algorithm for FPGA Designs," by D. Chen et al., ICCAD (November 2004) and "Improvements to Technology Mapping for LUT-Based FPGAs," by A. Mishchenko et al., IEEE Transactions on CAD, vol. 26, no. 2, pp. 240-253 (February 2007). The particular cut enumeration and/or cut selection techniques noted above are provided for purposes of illustration only and are not intended to limit the embodiments disclosed herein. It should be appreciated that the embodiments disclosed herein may be used independently and/or in combination with one or more other cut enumeration and/or cut selection techniques.

In accordance with the embodiments disclosed herein, the circuit design can be technology mapped, e.g., through cut enumeration and selection, in a manner that increases the likelihood of swapping opportunities described with reference to FIGS. 1-3. That is, the cut enumeration and/or selection process can be performed in a manner that can be guided, at least in part, according to signal symmetry. As each cut of a cut set corresponds to a logic component, e.g., a LUT, an evaluation of the various symmetric signals among LUTs, or cuts, can be determined and used to select one cut set over another.

Figure 5:
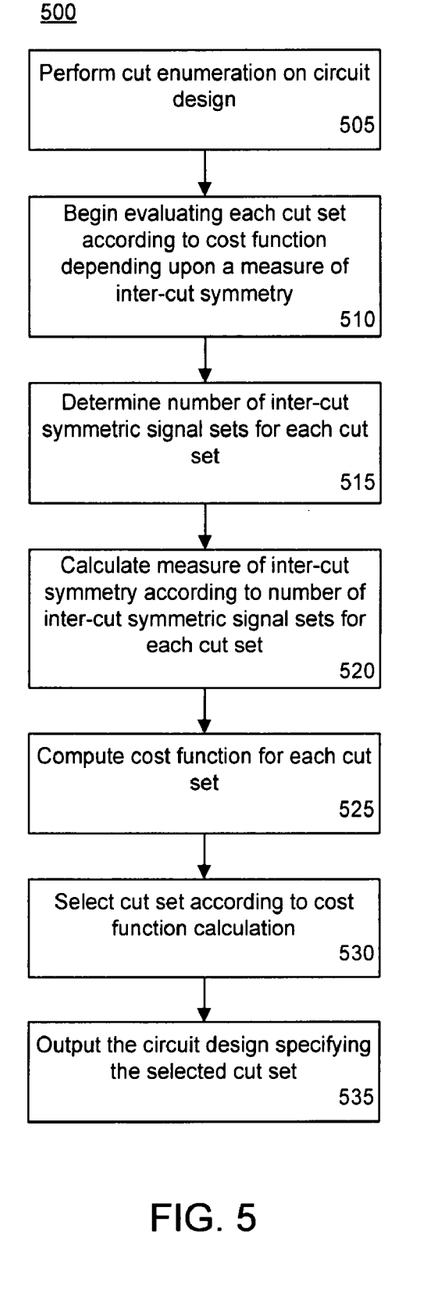
FIG. 5 is a flow chart illustrating a method of technology mapping a circuit design in accordance with another embodiment of the present invention.

FIG. 5 is a flow chart illustrating a method 500 of technology mapping a circuit design in accordance with another embodiment of the present invention. The method 500 can be performed by an EDA tool or other software-based analysis tool capable of implementing a circuit design within a PLD.

The method 500 can begin in a state in which the circuit design has been represented in programmatic form, e.g., as a DAG.

Accordingly, in step 505, cut enumeration can be performed upon the circuit design. One or more cut sets can be determined using any of a variety of different cut enumeration techniques as described herein. In step 510, evaluation of the cut sets can begin. Each cut set can be evaluated according to a cost function that depends, at least in part, upon a measure of inter-cut symmetry.

In step 515, the number of inter-cut symmetric signal sets for each cut set can be determined. More particularly, each cut of the cut set can be evaluated to identify the inputs to that cut set. In one embodiment, an inter-cut symmetric signal set can include at least one pair of two symmetric signals where one signal of the pair is located within a first cut of a cut set and a second signal of the pair is located within a different cut of the same cut set. As such, an inter-cut symmetric signal set can include a symmetric pair of signals. In another embodiment, transitive relationships among signals also can be evaluated such that symmetric pairs of signals determined to have a transitive relationship can be combined into a larger inter-cut symmetric signal set. In any case, the number of inter-cut symmetric signal sets, whether comprised of two or more signals, for each cut set can be counted.

In step 520, a measure of inter-cut symmetry can be determined for each cut set according to the number of inter-cut symmetric signal sets counted for each respective cut set. In one embodiment, the measure of inter-cut symmetry for a cut set can be the number of inter-cut symmetric signal sets counted in the cut set. In another embodiment, the number of inter-cut symmetric signal sets can be overweighted or underweighted through the addition or subtraction of a value or through multiplication by some weighting factor greater than or less than zero. This allows the importance of the measure of inter-cut symmetry to be increased or decreased within the cost function.

It should be appreciated that, in addition to the measure of inter-cut symmetry, the cost function can depend upon one or more other metrics such as, for example, area usage, number of LUTs, or the like. As such, the cost function can depend entirely upon the measures of inter-cut symmetry or any combination of inter-cut symmetry and other metrics. For instance, the measure of inter-cut symmetry for each cut set can be summed with other measures relating to area usage, number of LUTs, and/or LUT levels. The different metrics used further can be weighted according to preference. It should be appreciated that these examples of other metrics that can be used within the cost function to select a particular cut set are not exhaustive and, as such, are not intended to limit the embodiments disclosed herein.

In step 525, the cost function for each cut set can be computed. In step 530, the cut set having the highest "goodness" or value as determined from the cost function computation can be selected. In step 535, the circuit design can be output. The circuit design can specify the selected cut set which can be used for technology mapping the circuit design. As noted, each cut of the selected cut set can represent an instantiation of a logic component, e.g., a LUT, on the PLD within which the circuit design is to be implemented.

In another embodiment, in selecting a cut set, various quantities may be evaluated and given different levels of importance and/or considered independently. For example, exact area of a cut can be considered first. The area of a cut as determined by the number of LUTs needed to implement the cut on the PLD can be considered first, e.g., area minimization. If more than one cut set has an equivalent score, the measure of inter-cut symmetry can be used and/or applied. If two or more cut sets still are equally valued, a measure of delay can be used to select one cut set over the other(s).

Figure 6:
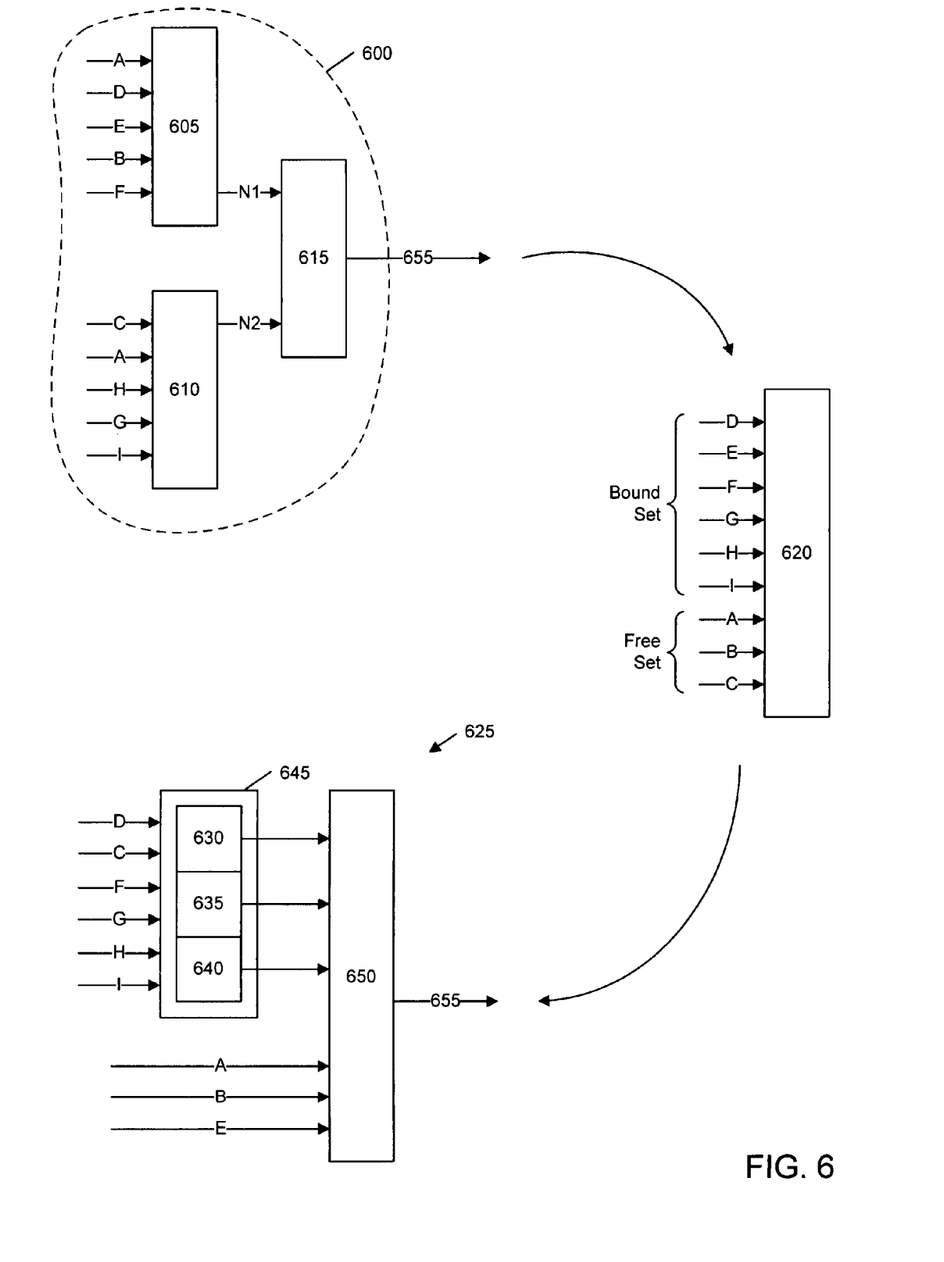
FIG. 6 depicts a plurality of circuit configurations illustrating a technique for symmetry-dependent functional decomposition in accordance with another embodiment of the present invention.

FIG. 6 depicts a plurality of circuit configurations illustrating a technique for symmetry-based functional decomposition in accordance with another embodiment of the present invention. As is known in the art, functional decomposition, in general, refers to the process in which a gate in a Boolean network is decomposed into a plurality of smaller gates. Accordingly, given a function $f(X,Y)$ that is defined over two sets of variables X and Y, sub-functions $g1(Y), g2(Y), \ldots, gk(Y)$ can be determined such that the function $f(X,Y)$ can be expressed as $f(X, g1(Y), g2(Y), \ldots, gk(Y))$.

Within FIG. 6, a cone 600 of logic components can be identified. The cone 600 can include LUTs 605, 610, and 615. As shown, signals A, D, E, B, and F can be inputs into LUT 605. Signals C, A, H, G, and I can be inputs to LUT 610. Output signal N1 can be provided from LUT 605 to LUT 615. Output signal N2 can be provided from LUT 610 to LUT 615. LUT 615 can provide an output signal 655.

There are a variety of different techniques for selecting and defining a cone, such as cone 600, upon which functional decomposition can be performed. For example, "BDD Based Decomposition of Logic Functions with Applications to FPGA Synthesis" by Lai et al., DAC (1993); "A Method for Finding Good Ashenhurst Decompositions and Its Application to FPGA Synthesis" by Stanion et al., DAC, pp. 60-64 (1995); "Timing Driven Functional Decomposition for FPGAs" by Singh et al., IWLS, Lake Arrowhead, Calif., USA, pp. 415-422 (June 2005); and "Unified Functional Decomposition via Encoding for FPGA Technology Mapping," by Jiang et al., IEEE Trans. VLSI, vol. 9, pp. 251-260 (April 2001) discuss different techniques and/or aspects of functional decomposition. Each of the references noted is fully incorporated herein by reference. Other cone selection techniques can be used in conjunction with the embodiments disclosed herein. Accordingly, the particular examples noted are not intended to limit the embodiments of the present invention.

In one embodiment, cone 600 can be selected and/or created from the circuit design due to the criticality of one or more timing critical signals. For example, one or more signals of the cone 600 can fail to meet a timing constraint. For purposes of illustration, consider the case in which signal A is timing critical. Further, it may be the case that signal A is symmetric with signals D and E. Because all of the symmetric signals are inputs to a same LUT, no opportunity for signal swapping exists.

Cone 600 can be collapsed into a single, composite LUT 620. In collapsing cone 600, the signals can be sorted or divided into a bound set of variables and a free set of variables, e.g., signals. The bound set of variables can include signals D, C, F, G, H, and I. The free set of variables can include signals A, B, and E. Since signal A is a timing critical signal, signal A can be assigned to the free set of variables. Assigning signal A to the free set of variables, e.g., signals, can have the effect of moving signal A closer to the output of the cone, which likely reduces or eliminates the criticality of signal A.

The composite LUT 620 can be broken down into decomposed logic 625. Decomposed logic 625 can include a plurality of LUTs 630, 635, 640, and 650. LUTs 630, 635, and 640, taken together, can be collectively referred to as logic gate 645. Each respective one of LUTs 630, 635, and 640 can implement one of the functions $g1(Y), g2(Y), \ldots, gk(Y)$. As shown, each of LUTs 630, 635, and 640 can output a signal to LUT 650. Signals A, B, and E, as members of the free set, can be provided directly to LUT 650. LUT 650 can output signal 655, which can be equivalent to signal 655 output from LUT 615 in cone 600 prior to functional decomposition.

When the composite LUT 620 is split into different LUTs to implement the decomposed function $f(X, g1(Y), g2(Y), \ldots, gk(Y))$, it can be seen that signal A has a direct path to LUT 650, thereby decreasing the timing criticality of signal A. As noted, signals D and E can be symmetric to signal A. In accordance with one embodiment, any symmetric signals can be split among the bound set of signals and the free set of signals during functional decomposition. Splitting symmetric signals between the two sets, or assigning at least one symmetric signal to the bound set and another symmetric signal to the free set, increases the opportunities for signal swapping described herein.

In this example, signal E has been assigned to the free set of signals with signal A. Signal D has been assigned to the bound set of signals. After functional decomposition, if signal D becomes timing critical, for example, a signal swapping opportunity can exist in that signal D may be swapped with signal E. Such a swapping operation may alleviate criticality of signal D. If signal E does not become timing critical, the swap may be accepted.

Figure 7:
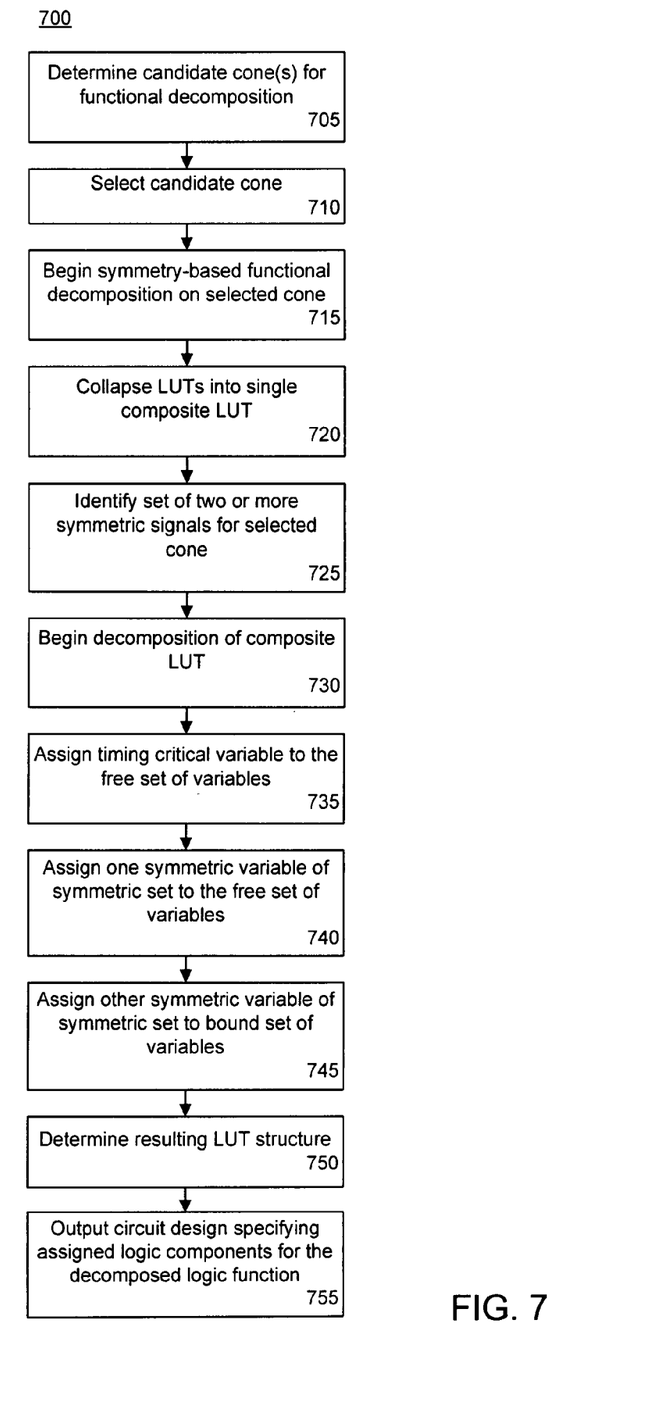
FIG. 7 is a flow chart illustrating a method of symmetry-dependent functional decomposition in accordance with another embodiment of the present invention.

FIG. 7 is a flow chart illustrating a method 700 of functional decomposition in accordance with another embodiment of the present invention. The method 700 can be performed by an EDA tool or other circuit design tool. The method 700 can begin in a state in which a circuit design has been loaded into the EDA tool and at least partially processed. For example, the circuit design may be technology mapped so that cones of logic components, such as LUTs, can be identified.

In step 705, one or more cones can be determined as candidate cones for functional decomposition. In one embodiment, candidate cones can be identified according to a timing-based functional decomposition technique. For example, using techniques known in the art, a seed LUT can be selected and a cone expansion operation can be performed to define one or more candidate cones. It should be appreciated that any of a variety of cone determination techniques can be used and the embodiments disclosed herein are not limited solely to a timing-based methodology. In step 710, a candidate cone can be selected. In one embodiment, the candidate cone having the most timing critical signal can be selected. It should be appreciated, however, that other methods and/or cost functions also can be applied and used for selecting a particular candidate cone for processing.

In step 715, symmetry-based functional decomposition can be implemented upon the selected cone. In step 720, the selected cone can be collapsed into a single, composite logic component. It should be appreciated that collapsing the selected cone into a composite logic component can be a computational step and is presented herein for purposes of illustration. A symmetry-based functional decomposition technique may or may not elaborate or define a composite logic component, but rather move directly from the selected cone, representing the function to be decomposed, to the decomposed function without explicit enumeration of the composite logic component.

In step 725, any signals, e.g., variables, that are symmetric in the cone can be identified as a symmetric set of signals. In step 730, decomposition of the composite logic component can be started. The process of decomposing the composite logic component, e.g., the function implemented by the composite logic component, into a plurality of smaller functions as described herein can be started.

In step 735, in decomposing the composite logic component, a timing critical signal can be identified and assigned to the free set of signals. It should be appreciated that while the embodiments disclosed herein are discussed with reference to a timing critical signal, such a signal is not required for implementing a symmetry-based technique for functional decomposition. That is, splitting or distributing symmetric signals among the bound set and the free set of signals can be performed irrespective of whether a timing critical signal exists in the cone.

In step 740, one of the symmetric signals of the symmetric set of signals can be assigned to the free set of signals. It may be the case that the symmetric signal also is a timing critical signal, though such a condition need not be the case. In step 745, another symmetric signal of the symmetric set of signals can be assigned to the bound set of signals. At a minimum, one symmetric signal of the symmetric set of signals can be assigned to the free set of signals and another symmetric signal of the symmetric set of signals can be assigned to the bound set of signals. It should be appreciated that where more than two symmetric signals exist in a symmetric set of signals, the signals may be equally distributed among the free set and the bound set or disproportionately distributed as may be desired.

In step 750, the resulting logic structure can be defined. That is, once symmetry-based functional decomposition is performed and the resulting sub-functions are determined, the resulting structure of logic components for the selected cone can be determined. In step 755, the resulting circuit design, specifying the newly determined circuit structure for the decomposed cone, can be output. For example, the circuit design specifying assigned logic components for the decomposed logic function can be output.

The flowchart(s) in the figure(s) illustrate the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figure(s). For example, two blocks shown in succession may, in fact, be executed substantially concurrently, or the blocks may sometimes be executed in the reverse order, depending upon the functionality involved. It also should be noted that each block of the flowchart illustration(s), and combinations of blocks in the flowchart illustration(s), can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of technology mapping a circuit design for implementation within a programmable integrated circuit, the method comprising:
   determining, via a computer, a plurality of cut sets for the circuit design, wherein each cut set comprises a plurality of cuts;
   determining, via the computer, a number of inter-cut symmetric signal sets of each cut set;
   selecting, via the computer, a cut set from the plurality of cut sets, at least in part, according to the number of inter-cut symmetric signal sets of each cut set, wherein each cut of the selected cut set represents an instantiation of at least one logic component within the programmable integrated circuit; and
   outputting the circuit design specifying the selected cut set.

2. The computer-implemented method of claim 1:
   wherein an inter-cut symmetric signal set comprises at least two symmetric nodes; and
   wherein a first node of the inter-cut symmetric signal set is located in a first cut of a cut set and a second node of the inter-cut symmetric signal set is located in a second cut of the same cut set.

3. The computer-implemented method of claim 2, wherein selecting a cut set further comprises:
   combining at least two inter-cut symmetric signal sets that are determined to have a transitive relationship with one another into a single, larger inter-cut symmetric signal set.

4. The computer-implemented method of claim 2, wherein a function of an inter-cut symmetric signal sets remains invariant when signals of the inter-cut symmetric signal set are swapped.

5. The computer-implemented method of claim 1, further comprising:
   assigning cuts of the selected cut set to component types of the programmable integrated circuit;
   selecting a cone comprising a plurality of logic components of the circuit design; and
   performing functional decomposition on the selected cone according, at least in part, to symmetry of variables of the selected cone.

6. The computer-implemented method of claim 5, wherein performing the functional decomposition on the selected cone comprises:
   identifying a plurality of symmetric signals of the selected cone;
   defining a free set of signals comprising at least one signal of the plurality of symmetric signals; and
   defining a bound set of signals comprising at least one different signal of the plurality of symmetric signals.

7. The computer-implemented method of claim 6, wherein defining the free set of signals comprises assigning a timing critical signal to the free set of signals.

8. The computer-implemented method of claim 7, further comprising selecting the timing critical signal to be one of the plurality of symmetric signals of the selected cone and swapping at least two of the symmetric signals.

9. A computer program product, comprising:
   a non-transitory computer-usable medium having computer-usable program code that implements a circuit design within a programmable integrated circuit, the computer-usable medium comprising:
   computer-usable program code that determines a plurality of cut sets for the circuit design, wherein each cut set comprises a plurality of cuts;
   computer-usable program code that determines a number of inter-cut symmetric signal sets of each cut set;
   computer-usable program code that selects a cut set from the plurality of cut sets, at least in part, according to the number of inter-cut symmetric signal sets of each cut set, wherein each cut of the selected cut set represents an instantiation of at least one logic component within the programmable integrated circuit; and
   computer-usable program code that outputs the circuit design specifying the selected cut set.

10. The computer program product of claim 9, wherein an inter-cut symmetric signal set comprises at least two symmetric nodes, wherein a first node of the inter-cut symmetric signal set is located in a first cut of a cut set and a second node of the inter-cut symmetric signal set is located in a second cut of the same cut set.

11. The computer program product of claim 10, wherein a function of an inter-cut symmetric signal sets remains invariant when signals of the inter-cut symmetric signal set are swapped.

12. The computer program product of claim 9, wherein the computer-usable medium further comprises:
  computer-usable program code that assigns cuts of the selected cut set to component types of the programmable integrated circuit;
  computer-usable program code that selects a cone comprising a plurality of logic components of the circuit design; and
  computer-usable program code that performs functional decomposition on the selected cone according, at least in part, to symmetry of signals of the selected cone.

13. The computer program product of claim 12, wherein the computer-usable program code that performs the functional decomposition on the selected cone comprises:
  computer-usable program code that identifies a plurality of symmetric signals of the selected cone;
  computer-usable program code that defines a free set of signals comprising at least one signal of the plurality of symmetric signals; and
  computer-usable program code that defines a bound set of signals comprising at least one different signal of the plurality of symmetric signals.

* * * * *